US011991868B2

(12) United States Patent
Schörner et al.

(10) Patent No.: US 11,991,868 B2
(45) Date of Patent: May 21, 2024

(54) ELECTRICAL APPLIANCE ARRANGEMENT HAVING AN ELECTRICAL APPLIANCE WHICH CAN BE FASTENED TO A SUPPORT ELEMENT, IN PARTICULAR A WALL

(71) Applicant: SEW-EURODRIVE GMBH & CO. KG, Bruchsal (DE)

(72) Inventors: Martin Schörner, Bruchsal (DE); Joachim Nikola, Kraichtal (DE); Hans Jürgen Kollar, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 16/979,015

(22) PCT Filed: Feb. 15, 2019

(86) PCT No.: PCT/EP2019/025044
§ 371 (c)(1),
(2) Date: Sep. 8, 2020

(87) PCT Pub. No.: WO2019/170290
PCT Pub. Date: Sep. 12, 2019

(65) Prior Publication Data
US 2020/0413564 A1 Dec. 31, 2020

(30) Foreign Application Priority Data
Mar. 5, 2018 (DE) ...................... 10 2018 001 687.1

(51) Int. Cl.
*H05K 7/20* (2006.01)
*H05K 7/02* (2006.01)

(52) U.S. Cl.
CPC ............. *H05K 7/2089* (2013.01); *H05K 7/02* (2013.01); *H05K 7/2039* (2013.01)

(58) Field of Classification Search
CPC ...... H05K 1/0203; H05K 7/20; H05K 7/2089; H05K 7/02; H05K 7/2039; H05K 7/20918; H05K 5/0204; H05K 7/1432
See application file for complete search history.

(56) References Cited

U.S. PATENT DOCUMENTS 6,411,514 B1 * 6/2002 Hussaini ................ H05K 7/209
361/689
9,210,827 B2 12/2015 Bäuml
(Continued)

FOREIGN PATENT DOCUMENTS

CN 103370996 A 10/2013
CN 103841806 A 6/2014
(Continued)

OTHER PUBLICATIONS

International Search Report issued in International Application No. PCT/EP2019/025044, dated May 10, 2019, pp. 1-2.

*Primary Examiner* — Adam B Dravininkas
(74) *Attorney, Agent, or Firm* — CARTER, DELUCA & FARRELL LLP

(57) ABSTRACT

An electrical appliance that can be fastened to a support element, in particular a wall, includes a heat sink, circuit boards, and a housing. The circuit boards are fastened to the heat sink in each case and the heat sink is able to be fastened or is fastened to the support element. The housing surrounds the circuit boards and is fastened to the heat sink.

13 Claims, 5 Drawing Sheets

(56) References Cited

U.S. PATENT DOCUMENTS

| | | | |
|---|---|---|---|
| 9,237,679 B2 | 1/2016 | Schoerner | |
| 2002/0036889 A1* | 3/2002 | Ruiz-Gomez | H05K 7/20909 361/695 |
| 2002/0064028 A1* | 5/2002 | Nielsen | H05K 7/20918 361/703 |
| 2002/0195262 A1* | 12/2002 | Kirchberger | H05K 7/14329 174/521 |
| 2004/0095730 A1* | 5/2004 | Youm | H01L 23/4006 361/718 |
| 2007/0145576 A1* | 6/2007 | Bayerer | H01L 23/3735 257/723 |
| 2008/0017174 A1* | 1/2008 | Kafer | H05K 7/20854 123/479 |
| 2008/0130232 A1* | 6/2008 | Yamamoto | H05K 7/20909 361/703 |
| 2008/0293261 A1* | 11/2008 | Zschieschang | H01L 23/367 439/55 |
| 2009/0231811 A1* | 9/2009 | Tokuyama | H02P 27/06 361/699 |
| 2010/0202109 A1* | 8/2010 | Zheng | H05K 7/20918 361/697 |
| 2016/0128208 A1 | 5/2016 | Bolik | |
| 2016/0211191 A1 | 7/2016 | Tan | |
| 2018/0279508 A1* | 9/2018 | Roan | H05K 7/20254 |
| 2018/0329002 A1* | 11/2018 | Lorenz | G01R 15/205 |
| 2019/0069438 A1* | 2/2019 | Guo | H05K 1/0203 |
| 2019/0230812 A1* | 7/2019 | Shintani | H05K 7/2039 |

FOREIGN PATENT DOCUMENTS

| | | |
|---|---|---|
| CN | 105265031 A | 1/2016 |
| CN | 105684564 A | 6/2016 |
| DE | 102015200375 A1 | 7/2016 |

* cited by examiner

ELECTRICAL APPLIANCE ARRANGEMENT HAVING AN ELECTRICAL APPLIANCE WHICH CAN BE FASTENED TO A SUPPORT ELEMENT, IN PARTICULAR A WALL

FIELD OF THE INVENTION

The present invention relates to an electrical appliance arrangement having an electrical appliance which can be fastened to a support element, in particular a wall.

BACKGROUND INFORMATION

It is conventional in certain arrangements to provide a heat sink for cooling heat-generating components.

SUMMARY

Example embodiments of the present invention provide an electrical appliance that may achieve an especially uncomplicated production.

According to example embodiments of the present invention, in an electrical appliance arrangement having an electrical appliance which can be fastened to a support element, in particular a wall, the electrical appliance has a heat sink, circuit boards, and a housing. The circuit boards are fastened to the heat sink in each case, and the heat sink is able to be fastened, or is fastened, to the support element, the housing in particular surrounding the circuit boards in the manner of a housing and being fastened to the heat sink.

This has the advantage that the heat sink carries the circuit boards and the housing and thus functions as a central support element of the appliance. The heat sink is able to be fastened to a support element of a machine or a system, e.g., to a wall. Through the fastening to this support element, the circuit boards and the housing are therefore retained as well.

The weight force of the respective circuit board thus is transferred to the wall via the heat sink. In the same manner, the weight force of the housing is transferred to the wall via the heat sink.

In addition, the heat sink also has an electric earth connection and thus functions as a shunt to the electrical ground.

According to example embodiments, the electrical appliance has a power module, which includes semiconductor switches which are actuated in a pulse-width-modulated manner, the power module in particular being situated on the first of the circuit boards. This has the advantage that the components operated in a clocked manner using high currents and/or voltages are situated on the first circuit board, which is thus disposed only on one side of the heat sink. A third circuit board, which carries an electronic circuit, may therefore be provided on the side of the heat sink facing away from the first circuit board. This electronic circuit is able to be operated without being affected by interference signals from the first circuit board because the heat sink is made of metal, in particular aluminum, and thus functions as a shield.

According to example embodiments, the power module is connected to the heat sink at a contact surface of the heat sink, in particular for the dissipation of heat. This offers the advantage that the heat sink fans out the entering heat flow. The peak temperature is therefore able to be kept as low as possible.

According to example embodiments, the contact surface is situated on a base plate of the heat sink. This has the advantage that the contact surface is situated in a region of the heat sink that has the greatest wall thickness.

According to example embodiments, cooling fins are premolded on the heat sink on the side of the base plate situated opposite the contact surface. This offers the advantage that the heat introduced at the contact surface is able to be dissipated from the base plate in the most direct manner possible via the cooling fins along which an airflow conveyed by a fan is moving, the fan being fixed in place on the heat sink.

According to example embodiments, a plate-shaped support section, situated in parallel with the base plate, is premolded on a first one of the cooling fins, and a plate-shaped wall section, situated perpendicular to the base plate, is premolded on the base plate, the base plate being situated between the support section and the wall section. The electrical appliance, in particular, may be able to be fastened and/or being fastened to the wall with the aid of the wall section. This offers the advantage that the support section is not a direct extension of the base plate but, while realized in parallel therewith, is implemented at an offset. In addition to the power module, which has a first height that extends to the contact surface on the base plate, additional components are able to be fitted on the first circuit board, which may have a second height, which particularly extends to the support section situated at a greater distance from the first circuit board on account of the offset. In other words, because the offset is such that the support section is situated at a greater distance from the first circuit board than the base plate is from the first circuit board, larger components are able to be placed in the region of the first circuit board covered by the support section on the side of the first circuit board facing the support section than in the region of the first circuit board covered by the base plate.

According to example embodiments, the wall section, base plate, cooling fins, and the support section are formed in one piece, i.e., in an integral fashion, as a heat sink, in particular, as an aluminum casting. This has the advantage that a stable fastening may be obtained.

According to example embodiments, the support section is offset from the base plate, that is to say, the plane of the support section lies in parallel with the plane of the base plate, but is set apart. This is considered advantageous insofar as larger components are able to be fitted on the first circuit board in the region adjacent to the support section than in the region adjacent to the base plate.

According to example embodiments, a receiving pocket is situated in the support section, one side of the receiving pocket being formed by a region of the first cooling fin, a heat-generating component, in particular a power component, especially a semiconductor switch, being disposed in the receiving pocket, and an electrically insulating, heat-conducting material being placed between the component and the receiving pocket, the elasticity of the material in particular being greater than that of aluminum and of the board material of the first one of the circuit boards, and its specific thermal conductivity amounting to at least one-tenth of that of aluminum. This has the advantage that the power component is surrounded on multiple sides by material of the receiving pocket, i.e., the heat sink, and is accommodated in the receiving pocket without play. Mechanical relative vibrations between the component and the receiving pocket may therefore be prevented.

According to example embodiments, the power component is inserted into a heat-conducting plastic sleeve, in particular a rubber sleeve, and accommodated together with it in the receiving pocket free of play. This is considered advantageous insofar as the plastic sleeve has an electrically insulating effect, but a satisfactory heat-conducting contact from the component to the heat sink is able to be achieved nevertheless. In particular, electrically insulating particles are added to the plastic material, which are excellent heat conductors, however. Especially suitable for this purpose are ceramic particles, in particular particles having a grain size of less than 10 micrometers.

According to example embodiments, a terminal for a protective earth (PE) connection, i.e., in particular an electrical ground connection, is situated on the wall section of the heat sink. This has the advantage that the heat sink is able to be used not only for cooling and supporting the appliance, but also for the electrical grounding or the shunting to electrical ground. This may be accomplished in a particularly advantageous manner if the wall connected to the wall section or a support part itself is made of metal and electrically grounded. Thus, if the wall is the rear wall of a switch case or a support part of a piece of machinery, then the heat sink together with the wall or the support part acts as a heat dissipator.

According to example embodiments, dome sections are premolded on both sides on the support section and dome sections are also premolded on the side of the base plate situated opposite the heat sinks. A first circuit board is fastened to first dome sections, in particular with the aid of screws, the first dome sections rising from the support section and being fastened to second dome sections, the second dome sections rising from the side of the base plate situated opposite the cooling fins. A third circuit board is fastened to third dome sections, in particular with the aid of screws, the third dome sections rising from the side of the support section situated opposite the first circuit board. A second circuit board is fastened to fourth dome sections, one of the fourth dome sections rising from one of the first dome sections, i.e., being premolded on the first dome section. The first circuit board is aligned in parallel with the third circuit board, and the first circuit board is set apart from the third circuit board. The support section in particular is situated between the first and the third circuit board, the second circuit board being situated perpendicular to the first and also perpendicular to the third circuit board. This has the advantage that the circuit board is able to be retained on the heat sink via dome sections.

According to example embodiments, a threaded bore is situated in the respective dome section for fastening the respective circuit board to the respective dome section, a screw head of a screw screwed into the respective threaded bore pressing the respective circuit board against the respective dome section. This offers the advantage that a simple fastening method is able to be obtained. It should be appreciated that the threaded bores of the fourth and the first dome section are set apart from each other or that the screws screwed into them do at least not touch despite the threaded bores being aligned perpendicular to one another and their bore axes intersecting.

According to example embodiments, the support section has reinforcement ribs on its side facing away from the first circuit board, in particular, reinforcement ribs arranged in the form of a grid. This has the advantage that greater stability is able to be achieved and the holding function, but also the heat-fanning function, may be carried out in a more optimal fashion.

According to example embodiments, each cooling fin has thickened regions, in particular, thickened regions that are set apart from one another at regular intervals. This has the advantage that the stability of the cooling fins and their function of spreading the heat are able to be obtained in an improved manner.

According to example embodiments, a third circuit board is situated on the side of the heat sink, in particular, the base plate and the support section, facing away from the contact surface, a first circuit board being situated on the side of the heat sink facing the contact surface, in particular, the base plate and the support section, the first circuit board being fitted with components actuated in a pulse-width-modulated manner, in particular, fitted with the power module actuated in a pulse-width-modulated manner. This offers the advantage that the heat sink functions as a shield. The electronic circuit disposed on the third circuit board is thus not disturbed by the components of the first circuit board that are operated in a clocked manner.

Further features and aspects of example embodiments of the present invention are described in greater detail below with reference to the appended Figures.

DETAILED DESCRIPTION

Figure 1:
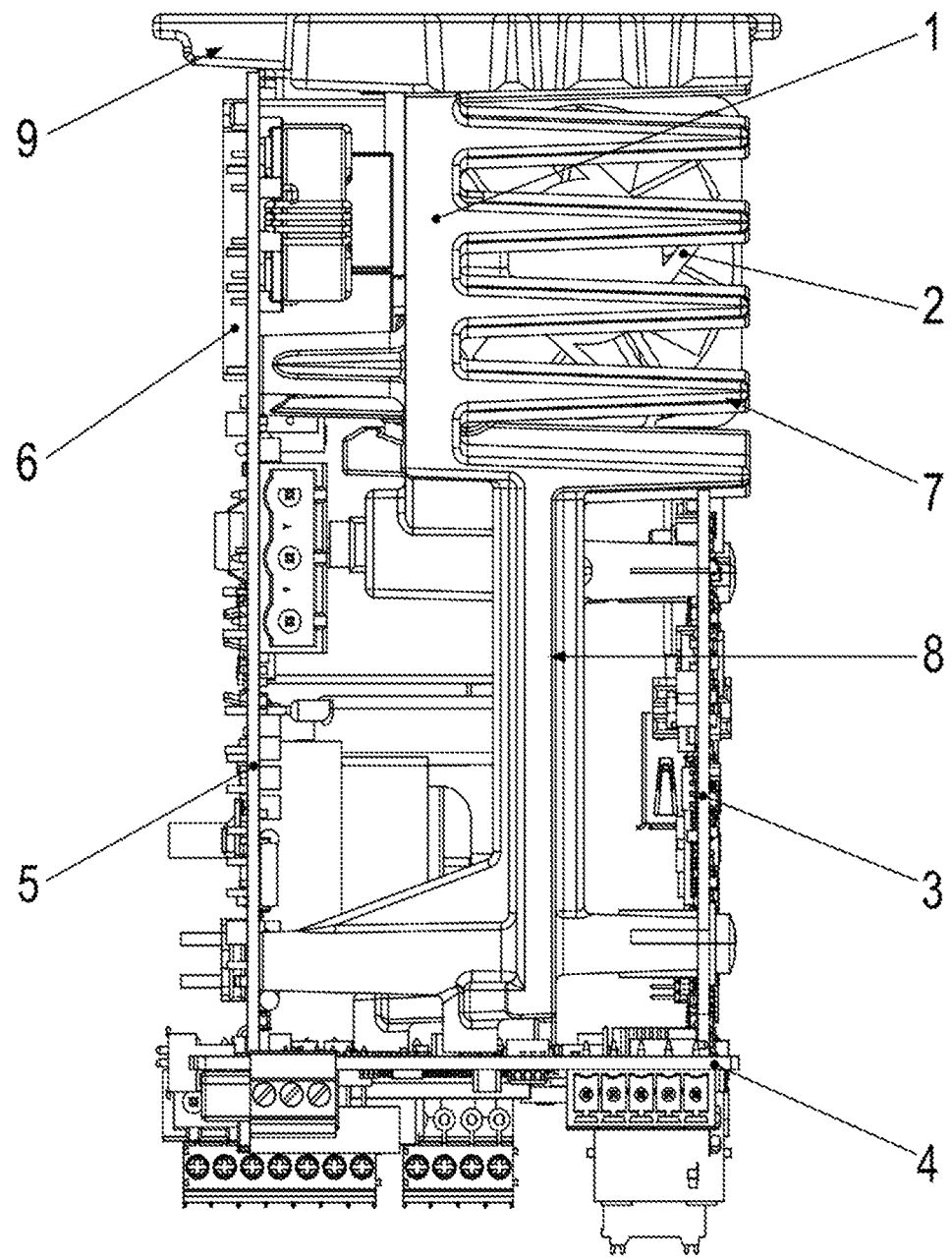
FIG. 1 is a schematic side view of an electrical appliance with the housing removed, the circuit boards (3, 4, 5) being fastened to a heat sink.

As schematically illustrated in the Figures, the electrical appliance, in particular, a converter provided to feed an electric motor, has heat sink 1 to whose sides the circuit boards (3, 4, 5) are fastened. A first (3) of the three circuit boards is aligned perpendicular to a second (4) of the three circuit boards, the second (4) of the three circuit boards being aligned perpendicular to the third (5) of the three circuit boards. The first circuit board (3) is aligned in parallel with third circuit board 5. The circuit boards (3, 4, 5) thus form a continuous U.

Third circuit board 5 is fitted with, or electrically connected to, a power module 6, which is pressed against a contact surface 30 provided on heat sink 1 by a spring element.

A fan is situated on heat sink 1, and the cool airflow it conveys streams along cooling fins arranged in parallel on heat sink 1.

Dome sections (32, 33, 34, 35, 41), which project from the sides, are arranged on heat sink 1. The thickness of the dome sections (32, 33, 34, 35, 41) may be such that a threaded bore is introduced at the outer end region of the respective dome section (32, 33, 34, 35, 41), into which a screw is able to be screwed whose widened screw head presses a respective circuit board (3, 4, 5) in the direction of the respective dome section (32, 33, 34, 35, 41).

The dome sections (36, 37) project on the front side, and the other dome sections (32, 33, 34, 35, 41) project from the two sides. The dome sections (36, 37) thus extend perpendicular to the other dome sections (32, 33, 34, 35, 41).

Heat sink 1 is arranged as one piece, i.e., in an integral fashion, and cooling fins 7 rise from a first side of the base plate of heat sink 1. Cooling fins 7 have a parallel alignment and are, for example, set apart from one another at regular intervals.

Dome sections 35 and 36 rise from the other side of the base plate. In addition, a finish-machined, in particular ground, surface piece is provided on this other side, which functions as a contact surface 30 for power module 6. During an operation of the electrical appliance, a strong heat flow from power module 6 is introduced into the base plate and from there into cooling fins 7. Cooling is possible with the aid of fan 2, which conveys an airflow along cooling fins 7.

A threaded bore is introduced into the base plate in the center of contact surface 30 so that power module 6 is able to be pressed against the contact surface with the aid of a screw, in particular, by the screw head of the screw, the screw being passed through power module 6 and screwed into the threaded bore.

The base plate thus functions as a retainer for one (5) of the three circuit boards (3, 4, 5) and for cooling fins 7 as well as for power module 6.

In parallel with cooling fins 7, that is to say, perpendicular to the base plate, a plate-shaped wall section 9 is premolded on the base plate. A terminal 10 for a PE connection is also provided on this support section.

With the aid of wall section 9, the electrical appliance is able to be fastened to a DIN mounting rail or to a wall of a switch case. The required holding forces are thus introduced via wall section 9.

The protective housing is also fastened to heat sink 1. All parts of the electrical appliance are therefore held by heat sink 1, which in turn is held on a wall or a machine with the aid of its wall section 9.

Cooling fins 7 are situated on only one side of the base plate. Wall section 9 includes the perpendicular projection of the entire rest of heat sink 1 onto wall section 9. Wall section 9 thus has a greater extension than the perpendicular projection, wall section 9 in particular being arranged as a plate-shaped, i.e., planar, part in this context.

As illustrated in the Figures, wall section 9 extends on both sides of the base plate of heat sink 1.

The base plate may be provided with a greater wall thickness in the region of contact surface 30, that is to say, in thicker form. This increases the thermal capacity in the region of contact surface 30 and the inflowing heat is thus able to be fanned out.

Dome sections 34 and 35 rise from the side of the base plate facing away from cooling fins 7. Respective dome section 35 has a self-supporting configuration.

However, with the aid of a connecting wall, dome section 34 is connected to wall section 9 with the result that not only the stability of heat sink 1 is improved, and specially also that of dome section 34, but the thermal capacity is greater in addition.

The base plate of heat sink 1 ends approximately in the center of wall section 9.

A plate-shaped support section 8 is formed on heat sink 1 at an offset from the base plate. Support section 8 thus ends in the particular cooling fin 7 that is situated at the greatest distance from wall section 9.

Dome sections 32 for fastening circuit board 5 also rise from support section 8.

On the side of circuit board 5 facing support section 8, circuit board 5 is fitted with a power component, in particular, with a controllable semiconductor switch such as a power supply transistor.

The power component, surrounded by a heat-conducting rubber sleeve, is inserted into a receiving pocket 31 premolded on heat sink 1. Thus, the power component is electrically insulated and connected to receiving pocket 31 in a heat-conducting manner. Instead of a rubber sleeve, some other electrically insulating material providing excellent thermal conductivity may also be used, the material being placed between receiving pocket 31 and the power component.

A dome section 32, which is situated on the same side of support section 8 as receiving pocket 31, is disposed on support section 8.

A further dome section 36 projects from this dome section 32 in the transverse direction, that is to say, in particular, transversely to the normal direction of support section 8, which substantially represents a plane. The threaded bore introduced into further dome section 36 thus has a perpendicular alignment to the respective threaded bore introduced into dome section 32.

Because further dome section 36 projects from dome section 32 on the side, high stability is achieved. A high material thickness, in particular, is provided for this purpose.

Receiving pocket 31 is situated on support section 8. This receiving pocket 31 is provided with side walls that rise from support section 8. Because of the rubber sleeve, the power component is accommodated in receiving pocket 31 free of play.

One of the side walls of receiving pocket 31 is premolded on the particular cooling fin in which support section 8 ends.

On the side of support section 8 facing away from receiving pocket 31, reinforcement fins 40 are premolded on support section 8.

In addition, two dome sections 41, which are set apart from each other and are connected with the aid of a connecting wall 42, rise from support section 8 on this side, connecting wall 42 likewise rising from support section 8 and also being integrally premolded on support section 8 similar to dome sections 41.

Cooling fins 7 have thickened regions 43, which are set apart from one another at regular intervals in the extension direction of cooling fins 7, i.e., in particular, in the direction of the cooling airflow streaming between the cooling fins.

Figure 2:
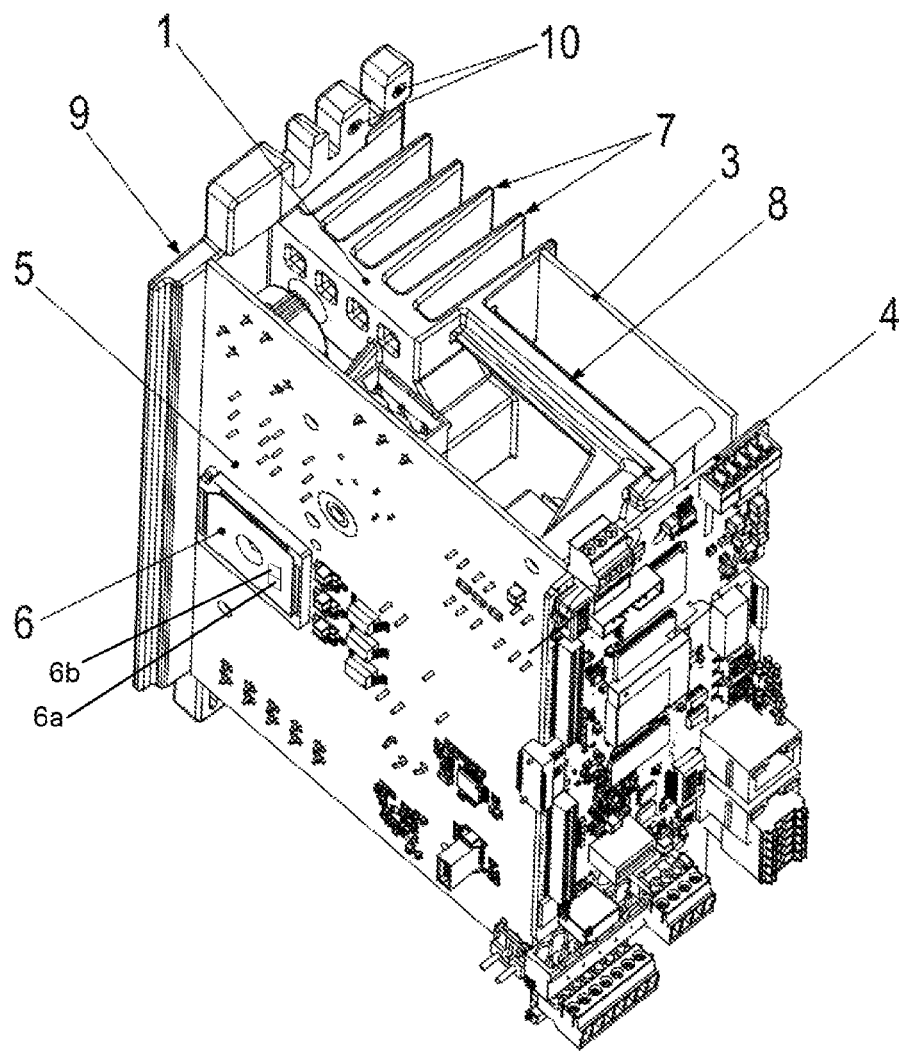
FIG. 2 is a schematic perspective view of the electrical appliance with the housing removed.
Figure 3:
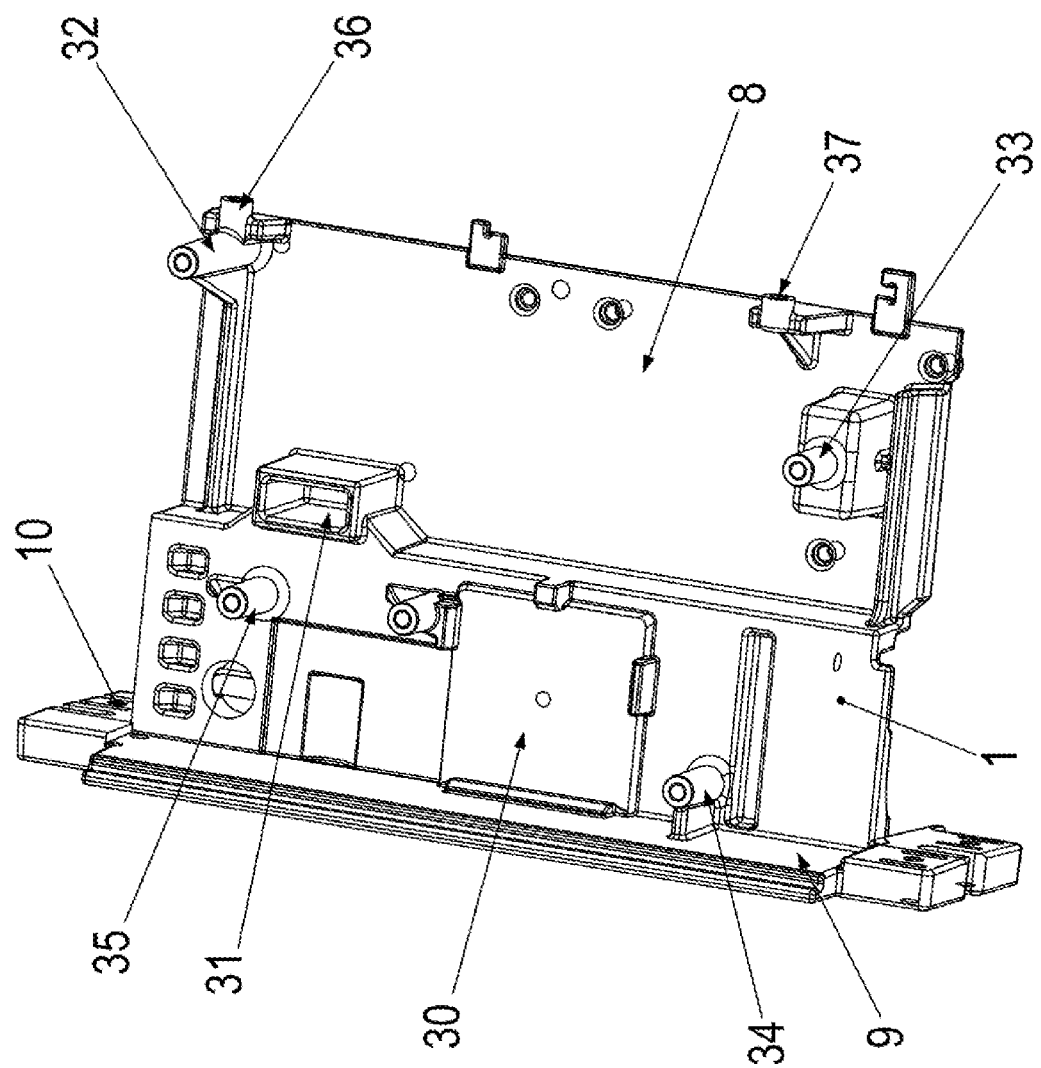
FIG. 3 illustrates a heat sink 1 in a schematic perspective view from a first perspective.
Figure 4:
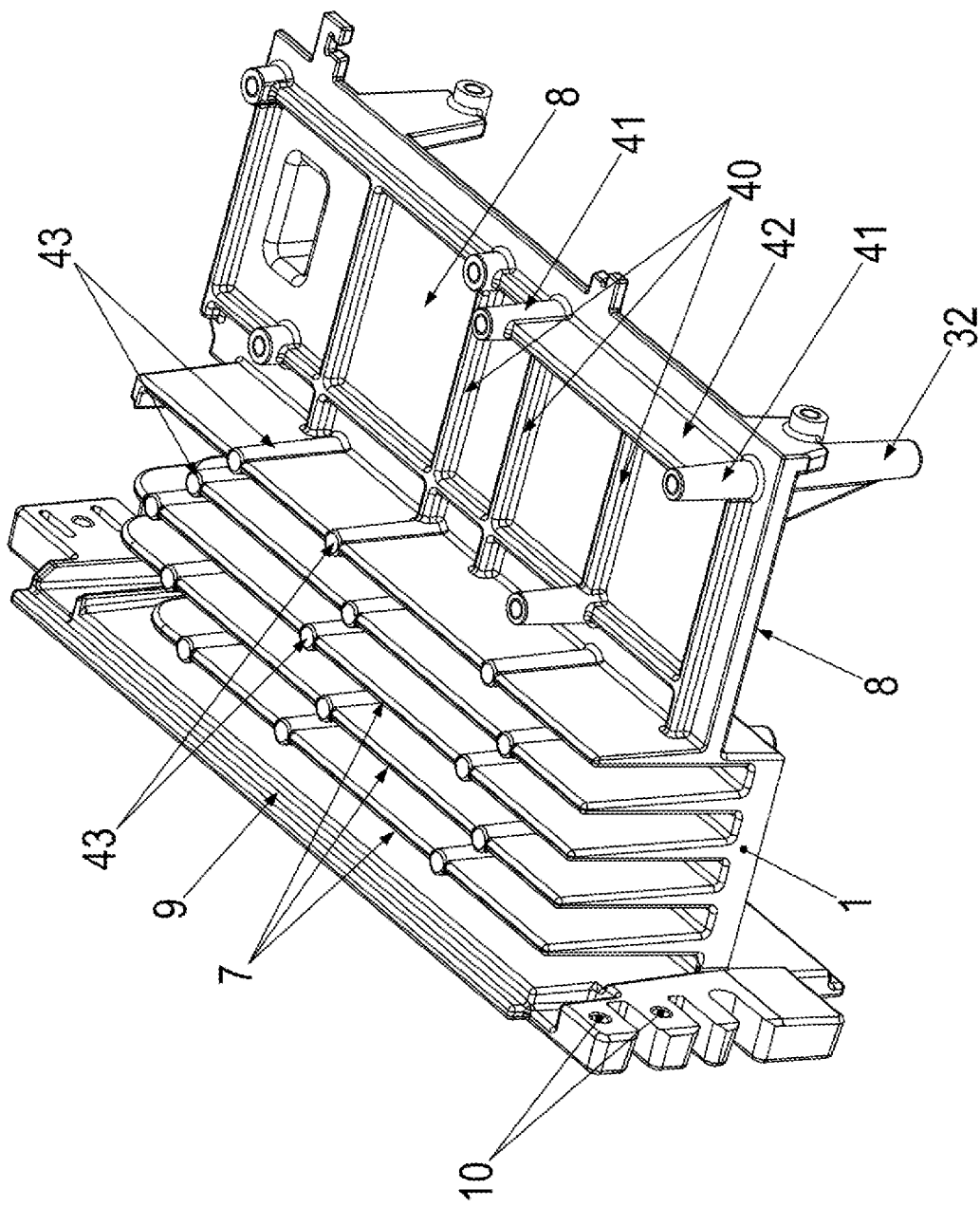
FIG. 4 illustrates heat sink 1 in a schematic perspective view from a second perspective.
Figure 5:
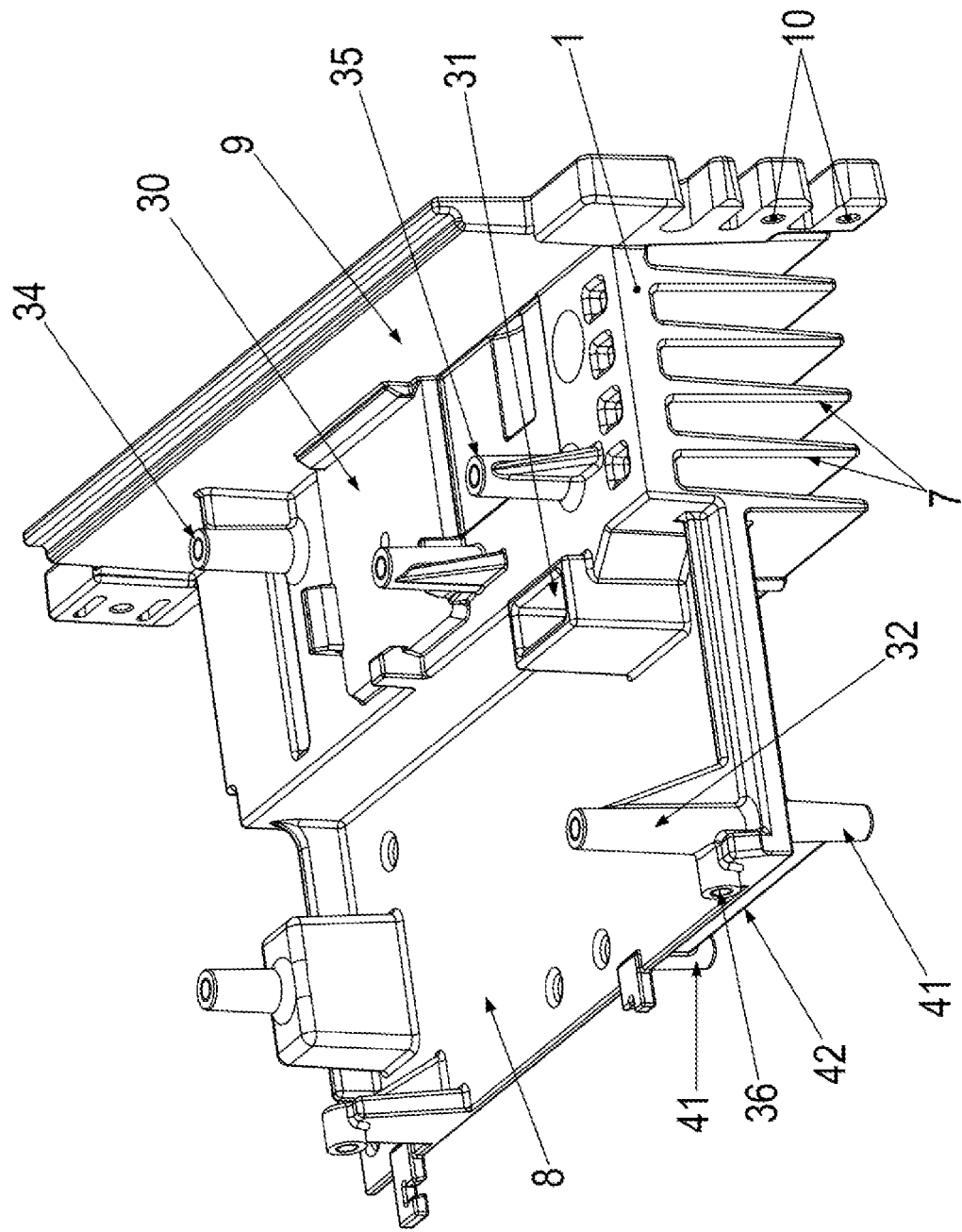
FIG. 5 illustrates heat sink 1 in a schematic perspective view from a third perspective.

As schematically illustrated in FIG. 2, the power module 6 has power switches 6a, 6b such as IGBTs or MOSFETs, in particular. These semiconductor switches 6a, 6b are arranged in half-bridges supplied with a DC voltage from a mains-powered rectifier. On the output side, the power module 6 provides a three-phase voltage system for the supply of a three-phase motor. The power switches 6a, 6b are, for example, operated in a pulse-width-modulated manner.

Because heat sink 1 is produced from metal, especially aluminum, support section 8 of heat sink 1 also functions as a shield of the electronic circuit situated on circuit board 3 from the power module and the actuator of the power module situated on circuit board 5.

Since support section 8 has a continuous configuration, efficient HF shielding is able to be achieved between the components operated in a clocked manner and the components of circuit board 3 situated on the other side of support section 8.

For example, a simple, cup-shaped housing produced from plastic is able to be pulled over heat sink 1 and the circuit boards (3, 4, 5) fastened thereto from the side of support section 8 situated opposite wall section 9. The housing is able to be fastened to the heat sink with the aid of a screw, in which case the screw is able to be screwed into a threaded bore of the heat sink. Alternatively, the housing may also be snapped into place on wall section 9.

LIST OF REFERENCE NUMERALS

1 heat sink
2 fan
3 third circuit board
4 second circuit board
5 first circuit board
6 power module
6a semiconductor switch
6b semiconductor switch
7 cooling fin
8 support section
9 wall section
10 terminal for PE connection
30 contact surface for power module 6
31 receiving pocket
32 dome section
33 dome section
34 dome section
35 dome section
36 dome section
37 dome section
40 reinforcement rib
41 dome section
42 connecting wall
43 thickened region

The invention claimed is:

1. A system, comprising:
an electrical appliance adapted to be fastened to a support element and including:
a heat sink;
circuit boards;
a housing; and
a power module including semiconductor switches adapted to be actuated in a pulse-width-modulated manner;
wherein each circuit board is fastened to the heat sink, and the heat sink is adapted to be fastened to the support element, the housing surrounding the circuit boards and being fastened to the heat sink;
wherein the power module is connected to the heat sink at a contact surface of the heat sink for dissipation of heat;
wherein the contact surface is arranged on a base plate of the heat sink;
wherein cooling fins are premolded on the heat sink on a side of the base plate located opposite the contact surface; and
wherein a plate-shaped support section, arranged parallel to the base plate, is premolded on a first one of the cooling fins, a plate-shaped wall section, arranged perpendicular to the base plate, is premolded on the base plate, and the base plate is disposed between the support section and the wall section.

2. The system according to claim 1, wherein the electrical appliance is adapted to be fastened and/or is fastened to the support element by the wall section.

3. The system according to claim 1, wherein the wall section, the base plate, the cooling fins, and the support section are integrally formed and/or formed in one piece as a heat sink and/or an aluminum casting.

4. The system according to claim 1, wherein a third circuit board is arranged on a side of the heat sink facing away from the contact surface, a first circuit board being arranged on a side of the heat sink facing the contact surface, the first circuit board being fitted with components and/or a power module adapted to be actuated in a pulse-width-modulated manner.

5. The system according to claim 1, wherein the support section is offset from the base plate and/or a plane of the support section is arranged parallel to and set apart from a plane of the base plate.

6. The system according to claim 1, wherein a receiving pocket is arranged in the support section, one side of the receiving pocket being formed by a region of the first cooling fin, a heat-generating component being arranged in the receiving pocket, and an electrically insulating, heat-conducting material being placed between the heat-generating component and the receiving pocket, elasticity of the material being greater than elasticity of aluminum and a board material of a first one of the circuit boards, and specific thermal conductivity of the material being at least one-tenth of specific thermal conductivity of aluminum.

7. The system according to claim 6, wherein the heat-generating component includes a power component and/or a semiconductor switch.

8. The system according to claim 7, wherein the power component is arranged in a heat-conducting plastic sleeve and/or a rubber sleeve and is accommodated in the receiving pocket with the heat-conducting plastic sleeve and/or the rubber sleeve free of play.

9. A system, comprising:
an electrical appliance adapted to be fastened to a support element and including:
a heat sink;
circuit boards; and
a housing;
wherein each circuit board is fastened to the heat sink, and the heat sink is adapted to be fastened to the support element, the housing surrounding the circuit boards and being fastened to the heat sink; and
wherein a terminal for a protective earth (PE) connection and/or an electrical ground connection is arranged on a wall section of the heat sink.

10. The system according to claim 1, wherein dome sections are premolded on both sides of the support section, and dome sections are premolded on a side of the base plate situated opposite the heat sink, a first circuit board being fastened and/or screw-mounted to first dome sections, the first dome sections rising from the support section and being fastened to second dome sections, the second dome sections rising from a side of the base plate arranged opposite the cooling fins, a third circuit board being fastened and/or screw-mounted to third dome sections, the third dome sections rising from a side of the support section arranged opposite the first circuit board, a second circuit board being fastened to fourth dome sections, one of the fourth dome sections rising from one of the first dome sections and/or being premolded on the first dome section, the first circuit board being aligned parallel to the third circuit board, the first circuit board being set apart from the third circuit board, the support section being arranged between the first circuit board and the third circuit board, the second circuit board being arranged perpendicular to the first circuit board and to the third circuit board.

11. The system according to claim 10, wherein a threaded bore is arranged in at least one of the dome sections to fasten a respective circuit board to a respective dome section, a screw head of a screw screwed into a threaded bore pressing the respective circuit board against the respective dome section.

12. The system according to claim 4, wherein the support section includes reinforcement ribs on a side of the support section facing away from the first circuit board.

13. The system according to claim 12, wherein the reinforcement ribs are arranged as a grid.

\* \* \* \* \*